United States Patent
Mikan, Jr. et al.

[11] Patent Number: 6,111,444
[45] Date of Patent: Aug. 29, 2000

[54] EDGE TRIGGERED LATCH

[75] Inventors: Donald George Mikan, Jr.; Eric Bernard Schorn, both of Austin, Tex.

[73] Assignee: International Business Machines Corporation, Armonk, N.Y.

[21] Appl. No.: 09/137,506

[22] Filed: Aug. 20, 1998

[51] Int. Cl.[7] .................... H03K 3/356; H03K 19/096
[52] U.S. Cl. ................ 327/211; 327/212; 326/98
[58] Field of Search .................... 327/211, 212, 327/200, 208; 326/95, 98

[56] References Cited

U.S. PATENT DOCUMENTS

| 4,845,675 | 7/1989 | Krenik et al. | 365/203 |
|---|---|---|---|
| 5,392,423 | 2/1995 | Yetter | 326/95 |
| 5,497,115 | 3/1996 | Millar et al. | 327/211 |
| 5,650,971 | 7/1997 | Longway et al. | 365/207 |
| 5,764,089 | 6/1998 | Partovi et al. | 327/200 |
| 5,867,049 | 2/1999 | Mohd | 327/200 |

OTHER PUBLICATIONS

R. Stephany et al., "A 200MHz 32b 0.5W CMOS RISC Microprocessor," 1998 IEEE International Solid–State Circuits Conference, pp. 238–239, (Fig. 2).

*Primary Examiner*—Timothy P. Callahan
*Assistant Examiner*—Terry L. Englund
*Attorney, Agent, or Firm*—Kelly K. Kordzik; Winstead Sechrest & Minick P.C.; Anthony V. S. England

[57] ABSTRACT

An edge triggered latch has an improved transparency window, which is essentially the delay of the N-stack pull-down tree. This minimizes the delay yet guarantees that the circuit will have enough time to evaluate the input data, since the evaluation is limited by the pulse width. This circuit eliminates early mode failure for latches placed in series, without the requirement of delay padding.

8 Claims, 2 Drawing Sheets

EDGE TRIGGERED LATCH

TECHNICAL FIELD

The present invention relates in general to logic circuitry, and in particular, to latches.

BACKGROUND INFORMATION

Latch circuits are extensively used within logic circuitry (e.g., microprocessor design) to temporarily store data until a succeeding circuit needs the data. One such type of latch is an edge triggered latch commonly used in the industry. "Edge triggered latch" is really a misnomer, since the latch is actually responding to some type of narrow pulse. An ideal pulse is as narrow as possible, but can still guarantee that the pulse is wide enough to cause the latch to evaluate. Prior art solutions have generated pulses which are 3–5 inversions wide. As the pulse becomes wider though, an early mode problem develops. That is, if the latch is transparent for greater than the amount of delay through the latch, then it is possible for a race condition to exist.

For the prior art schemes with 3–5 inversions, the designer would be required to place circuitry between successive latches to guarantee that no data could flush through two series latches while they were both transparent. This is sometimes referred to as "padding" the cycle with delay circuits, such as shown in circuit 200 in FIG. 2. In circuit 200, the transparency window is the width of the delays through inverters 201, 202, and 203. NFETs 204 and 205 complete the construction of the one-shot pulse generator caused by the rising edge of the clock signal (CLK).

The problem with circuit 200 is that the delay must be carefully designed to permit a proper evaluation of the incoming data but yet eliminate the early mode problem. It can be easily appreciated that such a design is difficult and time consuming, and the resultant design may fail due to variations in operating parameters, such as clock skew. As a result, there is a need in the art for an improved edge triggered latch design.

SUMMARY OF THE INVENTION

The foregoing need is addressed by the present invention. In an embodiment of the present invention, the latch includes circuitry for precharging an evaluation node coupled to an output of the latch, circuitry for precharging a second node coupled to a second output of the latch, wherein the second output is a complement of the first output, circuitry coupled to the first node for evaluating inputted data, circuitry coupled to the second node for evaluating a complement of the inputted data, and circuitry for disabling either the first or second node from evaluating when the other node evaluates the data.

The latch includes first and second PFETs receiving a clock signal for precharging first and second evaluation nodes coupled to the two complementary outputs of the latch circuit. First, second, and third NFETs are coupled in series between the first evaluation node and a ground potential. The first NFET receives a data signal at its gate electrode, the second NFET receives the clock signal, and the gate electrode of the third NFET is coupled to the second evaluation node. The latch circuit further includes fourth, fifth and sixth NFETs coupled in series between the second evaluation node and a ground potential. A gate electrode of the fourth NFET receives a complement of the data signal, a gate electrode of the fifth NFET is coupled to the clock signal, and a gate electrode of the sixth NFET is coupled to the first evaluation node.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
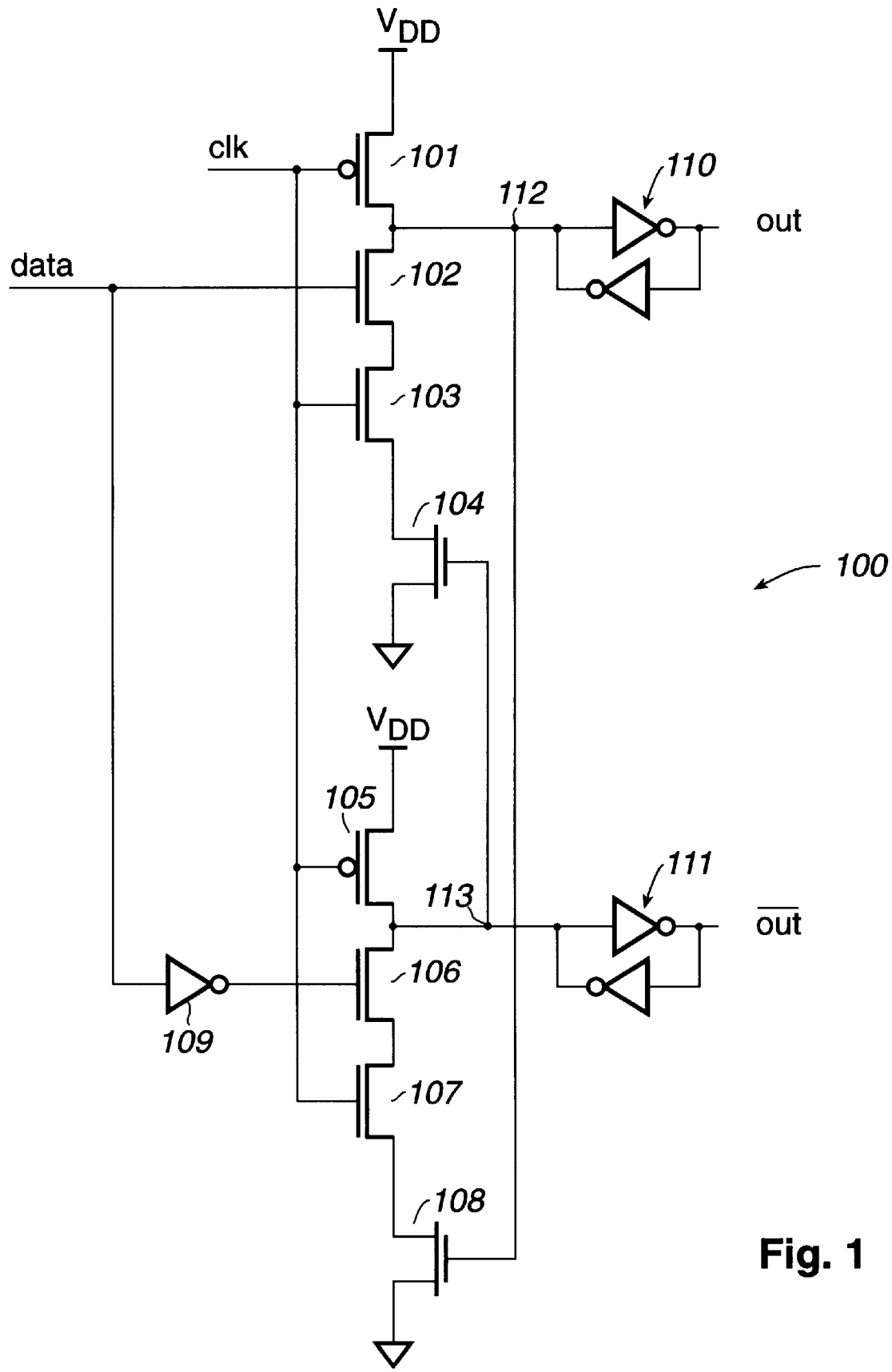
FIG. 1 illustrates an edge triggered latch in accordance with the present invention.
Figure 2:
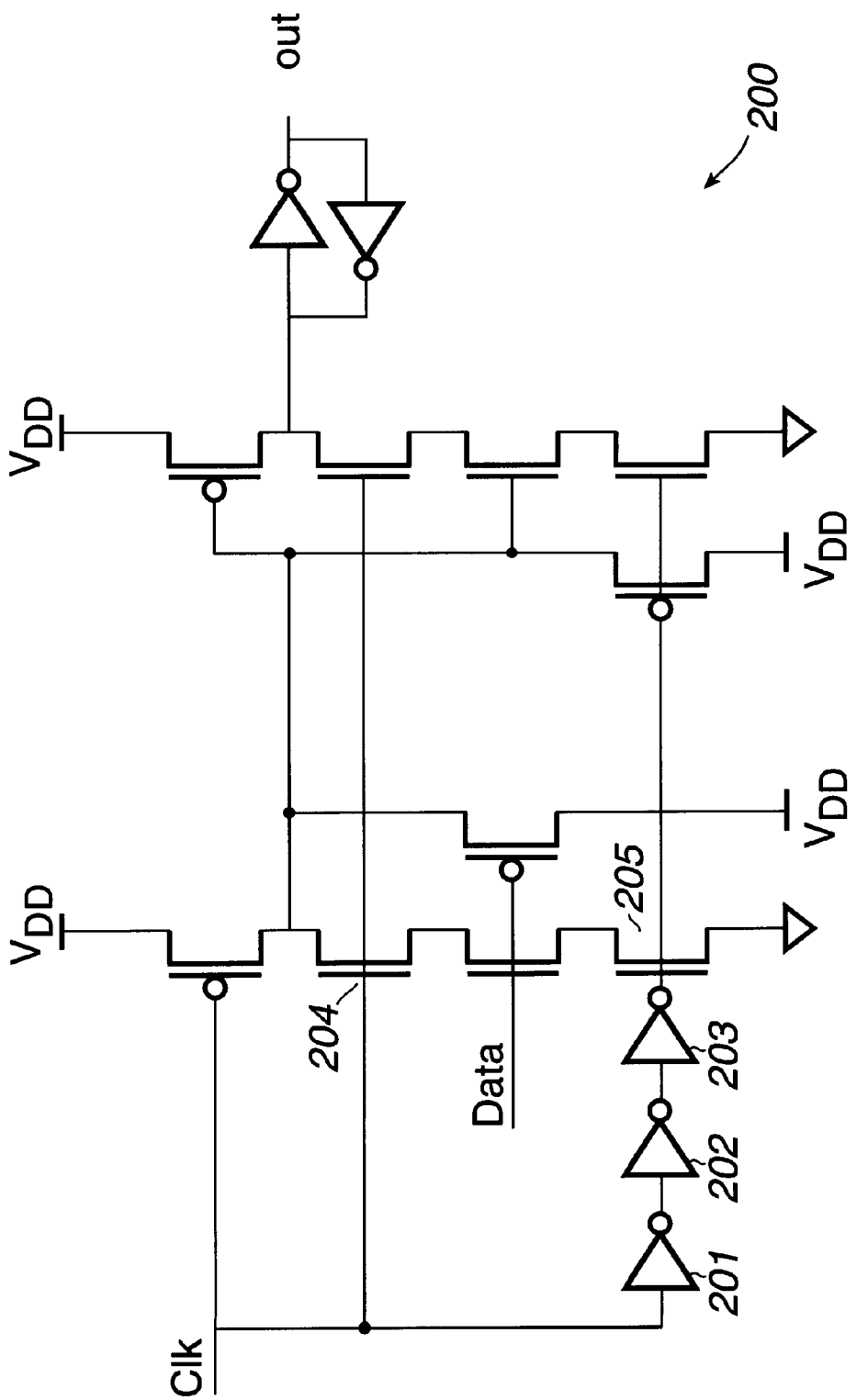
FIG. 2 illustrates a prior art edge triggered latch.

Referring to FIG. 1, there is illustrated edge triggered latch 100 in accordance with the present invention. The clock signal (CLK) is received by PFETs 101 and 105 and NFETs 103 and 107. The Data signal is received by NFET 102 and NFET 106 through inverter 109. PFET 101 operates to precharge node 112 during the precharge phase of the clock signal. Likewise, PFET 105 precharges node 113.

Node 112 is coupled to the gate electrode of NFET 108, while node 113 is coupled to the gate electrode of NFET 104.

Nodes 112 and 113 are coupled to cross-coupled inverters 110 and 111, respectively.

During operation of latch 100, only one of the outputs, Out, or its complement, $\overline{\text{Out}}$, may evaluate. As soon as it does, the complement side is disabled from evaluating, since it no longer has a conducting pull-down path to its evaluation node. Therefore, the effective transparency window is the N-stack pull-down delay. This is the smallest digital delay possible, yet circuit 100 is guaranteed to have enough time to evaluate, since the side evaluating has a full half cycle. This type of self-controlled pulse width virtually eliminates any possible race condition, or early mode failure, even if several of latches 100 are coupled in series (back-to-back). With circuit 100, no delay padding is required in most low clock skew environments. Furthermore, trivial modifications can be made to the output stage (e.g., the cross-coupled inverters 110 and 111) to make circuit 100 compatible with any static and dynamic circuit families.

An exemplary operation of circuit 100 will now be described. During the precharge phase, the clock signal is LOW, turning on PFETs 101 and 105 to precharge nodes 112 and 113 to a HIGH level. When the clock signal goes HIGH, PFETs 101 and 105 are turned off, and NFETs 103 and 107 are turned on. Furthermore, since nodes 112 and 113 are HIGH, NFETs 104 and 108 are also turned on. This will permit the data signals into NFETs 102 and 106 to evaluate. NFET 106 receives the complement data signal relative to the signal received by NFET 102 due to inverter 109.

If the data signal is HIGH at evaluation, NFET 106 will be turned off, while NFET 102 will evaluate the HIGH data signal. In such an instance, node 112 will be pulled down LOW to ground resulting in Out being latched HIGH and $\overline{\text{Out}}$ being latched LOW.

If the input data signal changes to a LOW level during this evaluation phase, the output of circuit 100 will remain, since the LOW level at node 112 turns off NFET 108, not permitting NFET 106 to evaluate the HIGH signal received by its gate electrode.

Although the present invention and its advantages have been described in detail, it should be understood that various changes, substitutions and alterations can be made herein without departing from the spirit and scope of the invention as defined by the appended claims.

What is claimed is:

1. A latch having first and second pre-chargeable nodes and receiving inputted data and a complement of said inputted data comprising:

circuitry, coupled to said first pre-chargeable node, for selectively evaluating said inputted data in response to a first binary signal and a voltage level on said second pre-chargeable node, wherein the circuitry for selectively evaluating said inputted data comprises:

a first NFET, said first NFET comprising a gate electrode coupled to said second pre-chargeable node, a first electrode coupled to a voltage potential and a second electrode;

a second NFET, said second NFET comprising a gate electrode receiving said first binary signal, a third electrode coupled to said second electrode and a fourth electrode; and a third NFET, said third NFET comprising a gate electrode receiving said inputted data, a fifth electrode coupled to said fourth electrode and a sixth electrode coupled to said first pre-chargeable node.

2. The latch according to claim 1, further comprising:

circuitry, coupled to said second pre-chargeable node, for selectively evaluating said complement of inputted data in response to said first binary signal and a voltage level on said first pre-chargeable node.

3. The latch of claim 1, wherein a cross-coupled inverter circuit is coupled to said first pre-chargeable node.

4. A latch having first and second pre-chargeable nodes and receiving inputted data and a complement of said inputted data comprising:

circuitry, coupled to said second pre-chargeable node, for selectively evaluating said complement of said inputted data in response to a first binary signal and a voltage level on said first pre-chargeable node, wherein the circuitry for selectively evaluating said complement of said inputted data comprises:

a first NFET, said first NFET comprising a gate electrode coupled to said first pre-chargeable node, a first electrode coupled to a voltage potential and a second electrode;

a second NFET, said second NFET comprising a gate electrode receiving said first binary signal, a third electrode coupled to said second electrode and a fourth electrode; and a third NFET, said third NFET comprising a gate electrode receiving said complement of said inputted data, a fifth electrode coupled to said fourth electrode and a sixth electrode coupled to said second pre-chargeable node.

5. The latch according to claim 4, further comprising:

circuitry, coupled to said first pre-chargeable node, for selectively evaluating said inputted data in response to said first binary signal and a voltage level on said second pre-chargeable node.

6. The latch of claim 4, wherein a cross-coupled inverter circuit is coupled to said second pre-chargeable node.

7. A latch having first and second pre-chargeable nodes and receiving inputted data and a complement of said inputted data comprising:

circuitry, coupled to said first pre-chargeable node, for selectively evaluating said inputted data in response to a first binary signal and a voltage level on said second pre-chargeable node, wherein the circuitry for selectively evaluating said inputted data comprises:

a first NFET, said first NFET comprising a gate electrode coupled to said second pre-chargeable node, a first electrode coupled to a voltage potential and a second electrode, a second NFET, said second NFET comprising a gate electrode receiving said first binary signal, a third electrode coupled to said second electrode and a fourth electrode; and a third NFET, said third NFET comprising a gate electrode receiving said inputted data, a fifth electrode coupled to said fourth electrode and a sixth electrode coupled to said first pre-chargeable node;

circuitry, coupled to said second pre-chargeable node, for selectively evaluating said complement of said inputted data in response to said first binary signal and a voltage level on said first pre-chargeable node, wherein the circuitry for selectively evaluating said complement of said inputted data comprises:

a fourth NFET, said fourth NFET comprising a gate electrode coupled to said first pre-chargeable node, a seventh electrode coupled to said voltage potential and an eighth electrode;

a fifth NFET, said fifth NFET comprising a gate electrode receiving said first binary signal, a ninth electrode coupled to said eighth electrode and a tenth electrode; and a sixth NFET, said sixth NFET comprising a gate electrode receiving said complement of said inputted data, an eleventh electrode coupled to said tenth electrode and a twelfth electrode coupled to said second pre-chargeable node.

8. The latch of claim 7, wherein a first cross-coupled inverter circuit is coupled to said first pre-chargeable node and a second cross-coupled inverter circuit is coupled to said second pre-chargeable node.

* * * * *